(12) United States Patent
Xing

(10) Patent No.: US 11,307,251 B1
(45) Date of Patent: Apr. 19, 2022

(54) CIRCUIT AND TESTING CIRCUIT THEREOF

(71) Applicant: Shanghai Zhaoxin Semiconductor Co., Ltd., Shanghai (CN)

(72) Inventor: Yunhao Xing, Beijing (CN)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 36 days.

(21) Appl. No.: 17/084,660

(22) Filed: Oct. 30, 2020

(30) Foreign Application Priority Data

Sep. 30, 2020 (CN) .......................... 202011054658.2

(51) Int. Cl.
*H03M 13/00* (2006.01)
*G01R 31/3185* (2006.01)

(52) U.S. Cl.
CPC ........... *G01R 31/318552* (2013.01); *G01R 31/31853* (2013.01); *G01R 31/318536* (2013.01); *G01R 31/318555* (2013.01); *G01R 31/318572* (2013.01)

(58) Field of Classification Search
CPC ...... G01R 31/318552; G01R 31/31853; G01R 31/318536; G01R 31/318555; G01R 31/318572
See application file for complete search history.

(56) References Cited

U.S. PATENT DOCUMENTS

| | | | | |
|---|---|---|---|---|
| 2005/0283695 | A1* | 12/2005 | Warren | G01R 31/318552 714/734 |
| 2008/0235545 | A1* | 9/2008 | Jayaram | G01R 31/318547 714/729 |
| 2018/0128875 | A1* | 5/2018 | Whetsei | G01R 31/318577 |

* cited by examiner

*Primary Examiner* — Christine T. Tu
(74) *Attorney, Agent, or Firm* — JCIPRNET

(57) ABSTRACT

A circuit, including a TAP circuit, a routing circuit, a first test path and a second test path, is provided. A first input terminal and a first output terminal of the routing circuit are respectively coupled to a scan output terminal and a first scan input terminal of the TAP circuit. A first terminal of the first test path is coupled to a second input terminal of the routing circuit. A second terminal of the first test path is coupled to a second output terminal of the routing circuit. A first terminal of the second test path is coupled to a third input terminal of the routing circuit. A second terminal of the second test path is coupled to a third output terminal of the routing circuit. The routing circuit couples the scan output terminal of the TAP circuit to the first scan input terminal of the TAP circuit or the first terminal of the first test path or the first terminal of the second test path.

14 Claims, 6 Drawing Sheets

CIRCUIT AND TESTING CIRCUIT THEREOF

CROSS-REFERENCE TO RELATED APPLICATION

This application claims the priority benefit of China application no. 202011054658.2, filed on Sep. 30, 2020. The entirety of the above-mentioned patent application is hereby incorporated by reference herein and made a part of this specification.

BACKGROUND

Technical Field

This disclosure relates to a circuit and a testing circuit thereof.

Description of Related Art

An automatic test pattern generation (ATPG) system is often used to perform test on chips in a chip aging experiment and a chip-based system test. The ATPG system is a tool that generates data (test pattern) for a tested circuit to perform a test. Multiple elements (such as registers, D flip-flops, etc.) in the tested circuit may be connected in series to form a scan chain during the test of the performance, yield, etc., of the tested circuit. The scan chain is also referred to as a test path. The ATPG system may complete the test by controlling fewer pins. The ATPG system may use ports (hereinafter referred to as JTAG ports) compliant with the Joint Test Action Group (JTAG) standard (or IEEE 1149.1 standard). The scan chain (test path) may be connected to a test data input pin TDI and a test data output pin TDO of a JTAG port. In addition, a test clock pin TCK of the JTAG port may transmit a shift clock signal to the scan chain.

FIG. 1 is a circuit block diagram of a conventional tested circuit 100. The tested circuit 100 shown in FIG. 1 includes a test access port (TAP) circuit 110 and at least one core circuit, such as core circuits PTN1 and PTN2 shown in FIG. 1. During a test, multiple elements in the core circuit PTN1, such as D flip-flops, may be selectively connected in series to form a scan chain (a test path 120). The same can be inferred for the core circuit PTN2, which also includes a scan chain (a test path 130). The scan chain is a well-known technology of the JTAG testing, therefore it will not be described in detail here.

The TAP circuit 110 is coupled to the test data input pin TDI and test data output pin TDO of the JTAG port. A scan output terminal of the TAP circuit 110 is coupled to a first terminal (input terminal) of the test path 120 of the core circuit PTN1 to provide a test pattern to the test data input pin TDI. A second terminal (output terminal) of the test path 120 is coupled to a first terminal (input terminal) of the test path 130 of the core circuit PTN2. A second terminal (output terminal) of the test path 130 is coupled to a scan input terminal of the TAP circuit 110. The TAP circuit 110 includes an instruction register IR and other components. The TAP circuit 110 is a well-known TAP circuit compliant with the JTAG standard (or IEEE 1149.1 standard), therefore it will not be described in detail here.

Every time the ATPG system performs a test, the ATPG system needs to serially provide a very long (many digits) test pattern to the test paths of the tested circuit 100, such as the test path 120 and the test path 130, through the JTAG port and the TAP circuit 110. In general, there will be a large number of test elements (such as D flip-flops) connected in series in the same test path (scan chain). A test path with a greater number of the test elements will require a test pattern with a longer length (greater number of digits), which will increase requirements of the ATPG system testing platform.

In addition, in general, the test path 120 and the test path 130 belong to the same clock domain. Therefore, the shift clock signal provided by the test clock pin TCK of the JTAG port may be provided to the test path 120 and the test path 130 concurrently. However, in engineering applications, the test paths 120 and 130 possibly belong to different clock domains. Therefore, during an ATPG capture operation, if the shift clock signal is still provided to both of the test paths 120 and 130, a timing error will occur in test elements of different clock domains, and will cause an error of the operation of the ATPG system or test results.

It should be noted that the information disclosed in the "related art" section is only for enhancement of the understanding of the disclosure. Part of the information (or all of the information) disclosed in the "related art" section may not be the conventional technology known to a person of ordinary skill in the art. The information disclosed in the "related art" section does not mean that the information has been known to persons of ordinary skill in the art before the application of this disclosure.

SUMMARY

The disclosure provides a circuit and a testing circuit thereof. The testing circuit uses multiple test paths of the circuit to test the circuit.

In an embodiment of the disclosure, the tested circuit includes a test access port circuit, a routing circuit, a first test path, and a second test path. A first input terminal and a first output terminal of the routing circuit are respectively coupled to a scan output terminal and a first scan input terminal of the test access port circuit. A first terminal of the first test path is coupled to a second input terminal of the routing circuit, and a second terminal of the first test path is coupled to a second output terminal of the routing circuit. A first terminal of the second test path is coupled to a third input terminal of the routing circuit, and a second terminal of the second test path is coupled to a third output terminal of the routing circuit. The routing circuit couples the scan output terminal of the test access port circuit to the first scan input terminal of the test access port circuit or the first terminal of the first test path or the first terminal of the second test path.

In an embodiment of the disclosure, the testing circuit includes the test access port circuit and a clock supply circuit. The scan output terminal of the test access port circuit is coupled to the first terminal of the first test path of the tested circuit. The second terminal of the first test path is coupled to the first terminal of the second test path of the tested circuit. The second terminal of the second test path is coupled to the first scan input terminal of the test access port circuit. In a shift operation mode, the clock supply circuit provides a shift clock signal to the first test path and the second test path. In a capture operation mode, the clock supply circuit provides a first clock signal to the first test path, and provides a second clock signal to the second test path.

Based on the above, in some embodiments of the disclosure, the testing circuit may selectively couple one or more of the multiple test paths to the test access port circuit. Therefore, the testing circuit may flexibly set the length(s) of the scan chain(s) based on the characteristics and/or the requirements of the testing platform of the ATPG system. In some embodiments, the testing circuit may provide different clock signals to different test paths belonging to different clock domains in the capture operation mode of the ATPG system, and provide the same clock signal to the different test paths in the shift operation mode of the ATPG system. Therefore, the testing circuit can enable the different test paths belonging to the different clock domains to capture correct data in the capture operation mode, thereby avoiding an error of the operation of the ATPG system or the test results.

To make the above features and advantages more comprehensible, several embodiments accompanied by drawings are described in detail as follows.

DESCRIPTION OF THE EMBODIMENTS

Figure 1:
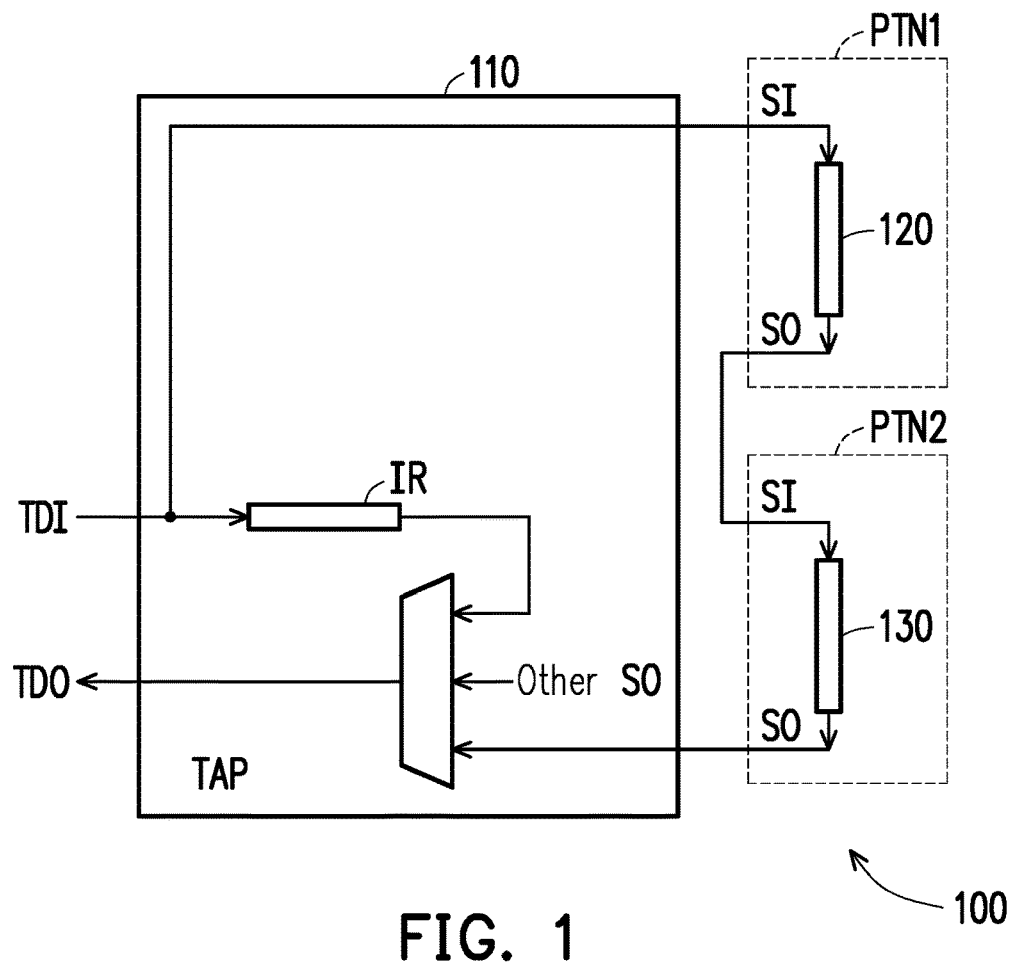
FIG. 1 is a schematic diagram of a conventional tested circuit 100.

The use of "coupled" or "connected" in this specification, including the appended claims, can refer to any direct or indirect connections. For example, if the text describes that a first device is coupled (or connected) to a second device, it should be interpreted as that the first device can be directly connected to the second device, or the first device can be indirectly connected to the second device through other devices or connection means. The terms such as "first" and "second" mentioned in this specification, including the appended claims, are used to name different elements or to distinguish between different embodiments or ranges, and are not intended to limit the upper or lower limit of the number of elements, or the order of the elements. In addition, whenever possible, the same reference symbols are used in the drawings and the embodiments to indicate elements, components or steps with the same or similar parts. Therefore, reference may be made among descriptions of the elements, components or steps in the different embodiments with the same or similar reference numerals or phraseology.

Figure 2:
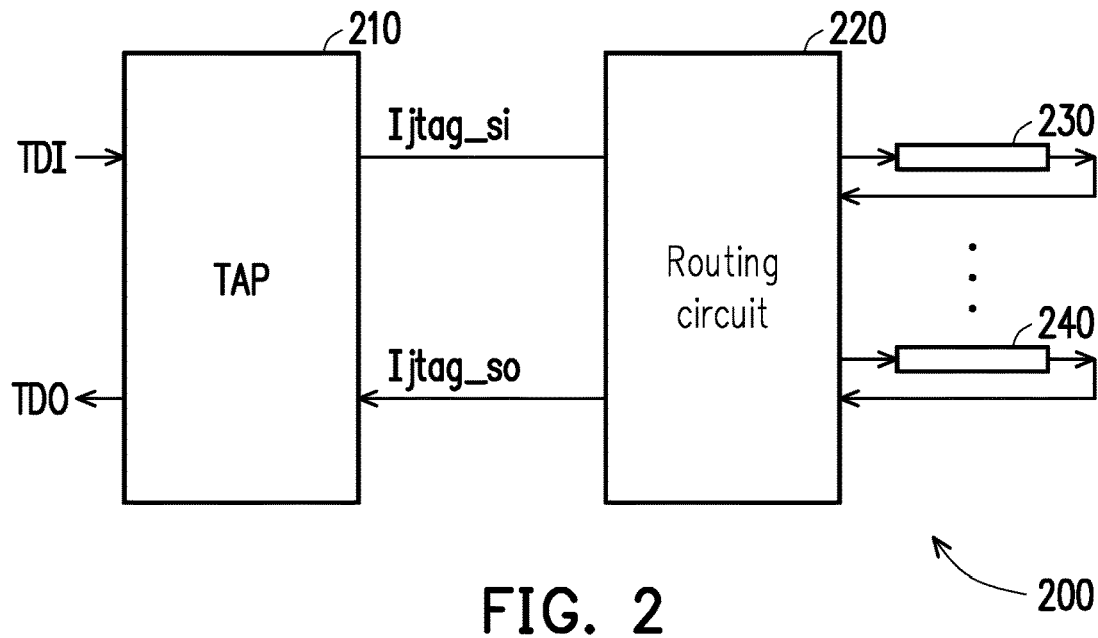
FIG. 2 is a schematic diagram of a tested circuit 200 according to an embodiment of the disclosure.

FIG. 2 is a schematic diagram of a tested circuit 200 according to an embodiment of the disclosure. Multiple flip-flops in the tested circuit 200 may be used as test elements in a test operation and be connected in series to form multiple scan chains, i.e., multiple test paths, such as test paths 230 and 240 shown in FIG. 2. In some embodiments, according to design requirements, the test paths 230 and 240 shown in FIG. 2 may be deduced by analogy with reference to the relevant descriptions of the test paths 120 and 130 shown in FIG. 1, which will not be reiterated here.

A testing circuit is configured in the tested circuit 200 to test the performance and yield of the tested circuit 200 through the test paths 230 and 240. In the embodiment shown in FIG. 2, the testing circuit includes a test access port (TAP) circuit 210 and a routing circuit 220. In some embodiments, according to the design requirements, the TAP circuit 210 may be a well-known TAP circuit compliant with the Joint Test Action Group (JTAG) standard or the IEEE 1149.1 standard, or any other TAP circuit. In other embodiments, the TAP circuit 210 may be deduced by analogy with reference to the relevant description of the TAP circuit 110 shown in FIG. 1.

A first input terminal and a first output terminal of the routing circuit 220 are respectively coupled to a scan output terminal Ijtag_si and a scan input terminal Ijtag_so of the TAP circuit 210. A second input terminal and a second output terminal of the routing circuit 220 are respectively coupled to both terminals of the test path 230, herein the test path 230 is one of the multiple test paths of the tested circuit 200. A third input terminal and a third output terminal of the routing circuit 220 are respectively coupled to both terminals of the test path 240, herein the test path 240 is another of the multiple test paths of the circuit to be tested 200. The routing circuit 220 may selectively couple the scan output terminal Ijtag_si of the TAP circuit 210 to at least one of the scan input terminal Ijtag_so, the test path 230, and the test path 240, and/or the routing circuit 220 may selectively couple the scan input terminal Ijtag_so of the TAP circuit 210 to at least one of the scan output terminal Ijtag_si, the test path 230 and the test path 240.

For example, in some cases, such as in a serial connection scan mode, the routing circuit 220 may selectively connect all the test paths (such as the test paths 230 and 240) of the tested circuit 200 in series into a long test path. The routing circuit 220 may selectively couple the scan output terminal Ijtag_si of the TAP circuit 210 to a first terminal of the long test path. The routing circuit 220 may also selectively couple the scan input terminal Ijtag_so of the TAP circuit 210 to a second terminal of the long test path. In other cases, such as in a partial scan mode, the routing circuit 220 may selectively couple the scan output terminal Ijtag_si and the scan input terminal Ijtag_so of the TAP circuit 210 respectively to the both terminals of one of the test path 230 and the test path 240. And the routing circuit 220 may cut off the connection between the TAP circuit 210 and the other of the test path 230 and the test path 240.

Based on the above, the routing circuit 220 of the testing circuit may selectively couple one or more of the multiple test paths of the tested circuit 200 to the TAP circuit 210 to perform a chip aging experiment, a chip system test and/or other tests. Therefore, the testing circuit may flexibly set a length(s) of the scan chain(s) based on characteristics and/or test requirements of a testing platform of the ATPG system. A block of the ATPG system may be implemented as hardware (such as firmware), software (such as a program) or a combination of the hardware and the software, according to different design requirements.

In terms of hardware, the block of the ATPG system may be implemented in a logic circuit on the circuit to be tested. A relevant function of the ATPG system may be implemented as the hardware using hardware description languages such as Verilog HDL, VHDL, or other suitable programming languages. For example, the relevant function of the ATPG system may be implemented in one or more controllers, a microcontroller, a microprocessor, an application-specific integrated circuit (ASIC), a digital signal processor (DSP), a field programmable gate array (FPGA)

and/or various logic blocks, modules and circuits in other processing units. In terms of the software and/or the firmware, a relevant function of the ATPG system may be implemented as a programming code. For example, the ATPG system is implemented by using general programming languages (such as C, C++ or assembly language) or other suitable programming languages. A computer, a central processing unit (CPU), a controller, a microcontroller, or a microprocessor may read and execute the programming code from a recording medium, thereby implementing the relevant function of the ATPG system.

Figure 3:
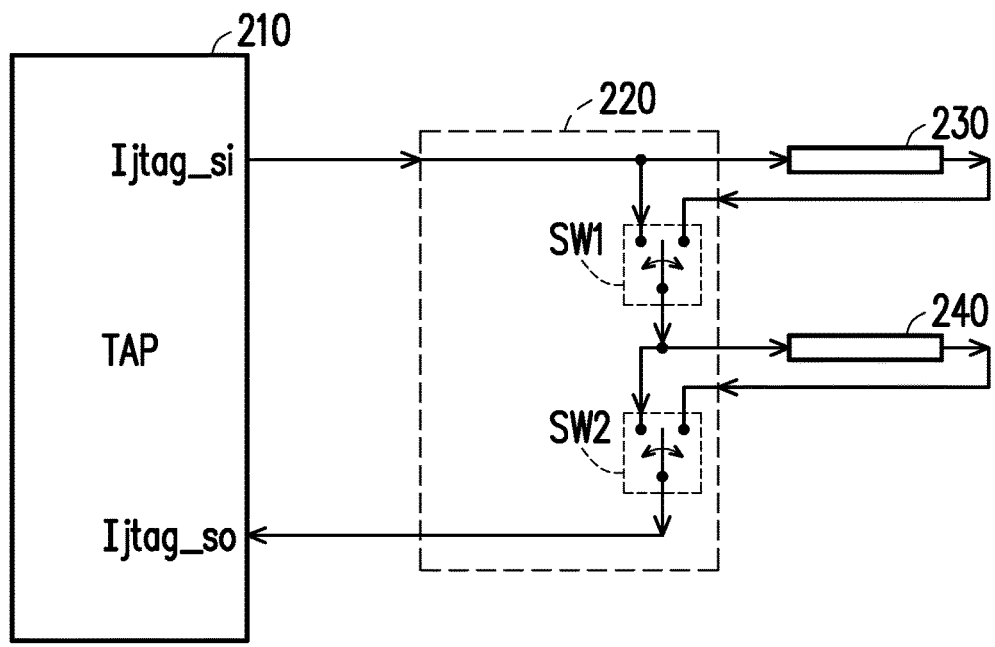
FIG. 3 is a schematic diagram of a routing circuit 220 according to an embodiment of the disclosure.

FIG. 3 is a schematic diagram of the routing circuit 220 according to an embodiment of the disclosure. In the embodiment shown in FIG. 3, the routing circuit 220 includes multiple switching circuits, such as switching circuits SW1 and SW2 shown in FIG. 3. Any one of the switching circuits SW1 and SW2 includes a first input terminal, a second input terminal and an output terminal, and is configured to be able to selectively electrically connect either the first input terminal or the second input terminal to the output terminal. The first input terminal of the switching circuit SW1 is coupled to the scan output terminal Ijtag_si of the TAP circuit 210 and a first terminal (input terminal) of the test path 230. The second input terminal of the switching circuit SW1 is coupled to a second terminal (output terminal) of the test path 230. The output terminal of the switching circuit SW1 is coupled to a first terminal (input terminal) of the test path 240. The first input terminal of the switching circuit SW2 is coupled to the output terminal of the switching circuit SW1. The second input terminal of the switching circuit SW2 is coupled to a second terminal (output terminal) of the test path 240. The output terminal of the switching circuit SW2 is coupled to the scan input terminal Ijtag_so of the TAP circuit 210.

When the second input terminal of the switching circuit SW1 is electrically connected to the output terminal of the switching circuit SW1, and the first input terminal of the switching circuit SW2 is electrically connected to the output terminal of the switching circuit SW2, the routing circuit 220 may selectively couple the scan output terminal Ijtag_si of the TAP circuit 210 to the first terminal (input terminal) of the test path 230. And the routing circuit 220 may selectively couple the second terminal (output terminal) of the test path 230 to the scan input terminal Ijtag_so of the TAP circuit 210. At this time, the connection between the test path 240 and the TAP circuit 210 is cut off. When the first input terminal of the switching circuit SW1 is electrically connected to the output terminal of the switching circuit SW1, and the second input terminal of the switching circuit SW2 is electrically connected to the output terminal of the switching circuit SW2, the routing circuit 220 may selectively couple the scan output terminal Ijtag_si of the TAP circuit 210 to the first terminal (input terminal) of the test path 240. And the routing circuit 220 may selectively couple the second terminal (output terminal) of the test path 240 to the scan input terminal Ijtag_so of the TAP circuit 210. At this time, the connection between the test path 230 and the TAP circuit 210 is cut off.

When the second input terminal of the switching circuit SW1 is electrically connected to the output terminal of the switching circuit SW1, and the second input terminal of the switching circuit SW2 is electrically connected to the output terminal of the switching circuit SW2, the routing circuit 220 may connect the test paths 230 and 240 in series to form a long test path. The routing circuit 220 may couple the scan output terminal Ijtag_si and the scan input terminal Ijtag_so of the TAP circuit 210 respectively to both terminals of the long test path. When the first input terminal of the switching circuit SW1 is electrically connected to the output terminal of the switching circuit SW1, and the first input terminal of the switching circuit SW2 is electrically connected to the output terminal of the switching circuit SW2, the routing circuit 220 may selectively couple the scan output terminal Ijtag_si of the TAP circuit 210 to the scan input terminal Ijtag_so of the TAP circuit 210.

The embodiment does not limit the implementation of the switching circuits SW1 and SW2. In some embodiments, the switching circuits SW1 and/or SW2 may be a segment insertion bit (SIB) element of the JTAG standard (or IEEE 1149.1 standard) according to the design requirements. The SIB element is well-known, therefore it will not be described in detail here. In other embodiments, the switching circuits SW1 and/or SW2 may be a switching element/circuit, or a multiplexer, etc.

Figure 4:
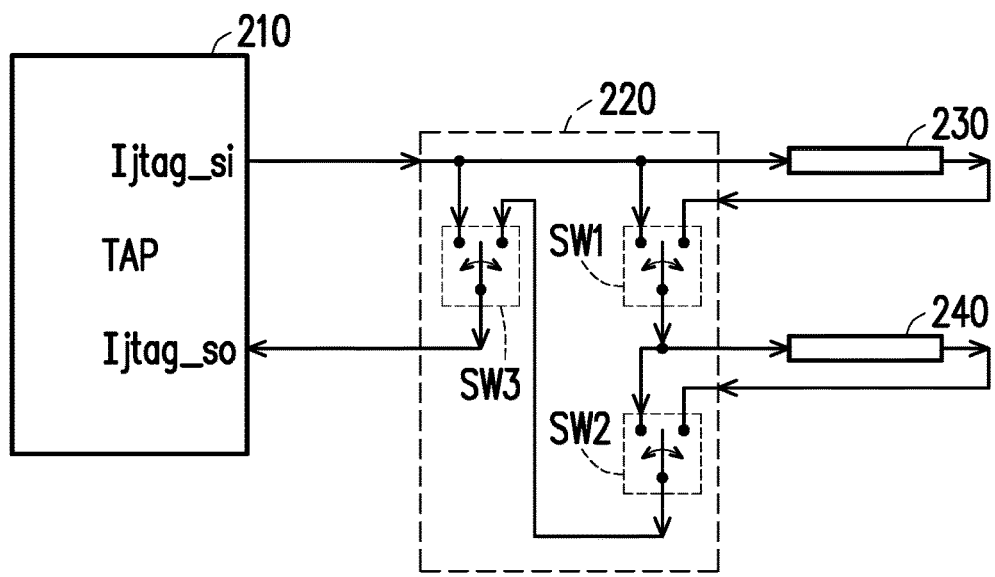
FIG. 4 is a schematic diagram of the routing circuit 220 according to another embodiment of the disclosure.

FIG. 4 is a circuit block diagram of the routing circuit 220 according to another embodiment of the disclosure. In the embodiment shown in FIG. 4, the routing circuit 220 includes multiple switching circuits, such as switching circuits SW1, SW2, and SW3 shown in FIG. 4. The first input terminal of the switching circuit SW1 is coupled to the scan output terminal Ijtag_si of the TAP circuit 210 and the first terminal (input terminal) of the test path 230. The second input terminal of the switching circuit SW1 is coupled to the second terminal (output terminal) of the test path 230. The output terminal of the switching circuit SW1 is coupled to the first terminal (input terminal) of the test path 240. The first input terminal of the switching circuit SW2 is coupled to the output terminal of the switching circuit SW1. The second input terminal of the switching circuit SW2 is coupled to the second terminal (output terminal) of the test path 240. The output terminal of the switching circuit SW2 is coupled to a second input terminal of the switching circuit SW3. A first input terminal of the switching circuit SW3 is coupled to the scan output terminal Ijtag_si of the TAP circuit 210. An output terminal of the switching circuit SW3 is coupled to the scan input terminal Ijtag_so of the TAP circuit 210. The switching circuits SW1, SW2, and/or SW3 shown in FIG. 4 may be deduced by analogy with reference to the relevant description of the switching circuits SW1 and/or SW2 shown in FIG. 3, which will not be reiterated here.

Figure 5:
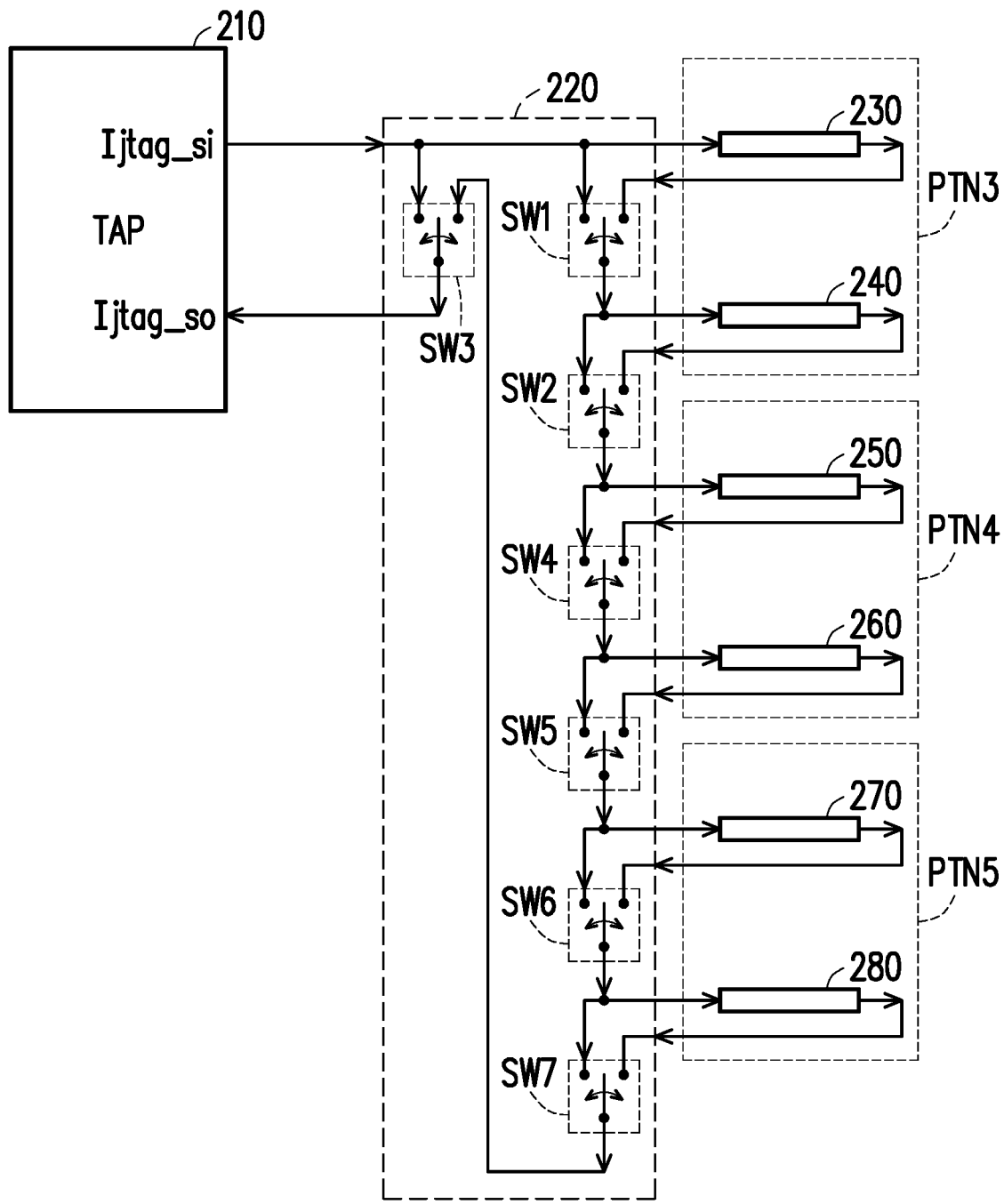
FIG. 5 is a schematic diagram of the routing circuit 220 according to yet another embodiment of the disclosure.

FIG. 5 is a schematic diagram of routing circuit 220 according to another embodiment of the disclosure. In the embodiment shown in FIG. 5, the tested circuit 200 includes a core circuit PTN3, a core circuit PTN4, and a core circuit PTN5. The core circuit PTN5 may be an upper level circuit of the core circuit PTN3 and the core circuit PTN4. Each of the core circuits PTN3, PTN4, and PTN5 includes multiple test paths. For example, the core circuit PTN3 includes the test paths 230 and 240, the core circuit PTN4 includes test paths 250 and 260, and the core circuit PTN5 includes test paths 270 and 280. The test paths 230, 240, 250, 260, 270, and/or 280 shown in FIG. 5 may be deduced by analogy with reference to the relevant descriptions of the test paths 230 and/or 240 shown in FIG. 3 or FIG. 4, which will not be reiterated here.

In the embodiment shown in FIG. 5, the routing circuit 220 includes multiple switching circuits, such as switching circuits SW1, SW2, and SW3, SW4, SW5, SW6, and SW7 shown in FIG. 5. The first input terminal of the switching circuit SW1 is coupled to the scan output terminal Ijtag_si of the TAP circuit 210 and the first terminal (input terminal) of the test path 230. The second input terminal of the switching circuit SW1 is coupled to the second terminal (output terminal) of the test path 230. The output terminal of the switching circuit SW1 is coupled to the first terminal (input terminal) of the test path 240 and the first input terminal of the switching circuit SW2. The second input terminal of the switching circuit SW2 is coupled to the second terminal (output terminal) of the test path 240. The output terminal of the switching circuit SW2 is coupled to a first terminal (input terminal) of the test path 250 and a first input terminal of the switching circuit SW4. A second input terminal of the switching circuit SW4 is coupled to a second terminal (output terminal) of the test path 250. An output terminal of the switching circuit SW4 is coupled to a first terminal (input terminal) of the test path 260 and a first input terminal of the switching circuit SW5. A second input terminal of the switching circuit SW5 is coupled to a second terminal (output terminal) of the test path 260. An output terminal of the switching circuit SW5 is coupled to a first terminal (input terminal) of the test path 270 and a first input terminal of the switching circuit SW6. A second input terminal of the switching circuit SW6 is coupled to a second terminal (output terminal) of the test path 270. An output terminal of the switching circuit SW6 is coupled to a first terminal (input terminal) of the test path 280 and a first input terminal of the switching circuit SW7. A second input terminal of the switching circuit SW7 is coupled to a second terminal (output terminal) of the test path 280. An output terminal of the switching circuit SW7 is coupled to the second input terminal of the switching circuit SW3. The first input terminal of the switching circuit SW3 is coupled to the scan output terminal Ijtag_si of the TAP circuit 210. The output terminal of the switching circuit SW3 is coupled to the scan input terminal Ijtag_so of the TAP circuit 210.

Implementations and switching operations of the switching circuits SW1, SW2, SW4, SW5, SW6, SW7 and/or SW3 shown in FIG. 5 may be deduced by analogy with reference to the relevant descriptions of the switching circuits SW1, SW2, and/or SW3 shown in FIG. 4, which will not be reiterated here. Based on the switching operations of the switching circuits SW1, SW2, SW4, SW5, SW6, SW7, and/or SW3 shown in FIG. 5, the routing circuit 220 may selectively couple one or more of the multiple test paths 230~280 of the tested circuit 200 to the TAP circuit 210 to perform the chip aging experiment, the chip system test and/or other tests. Therefore, the testing circuit may flexibly set the length(s) of the scan chain(s) based on the characteristics and/or the test requirements of the testing platform of the ATPG system.

Figure 6:
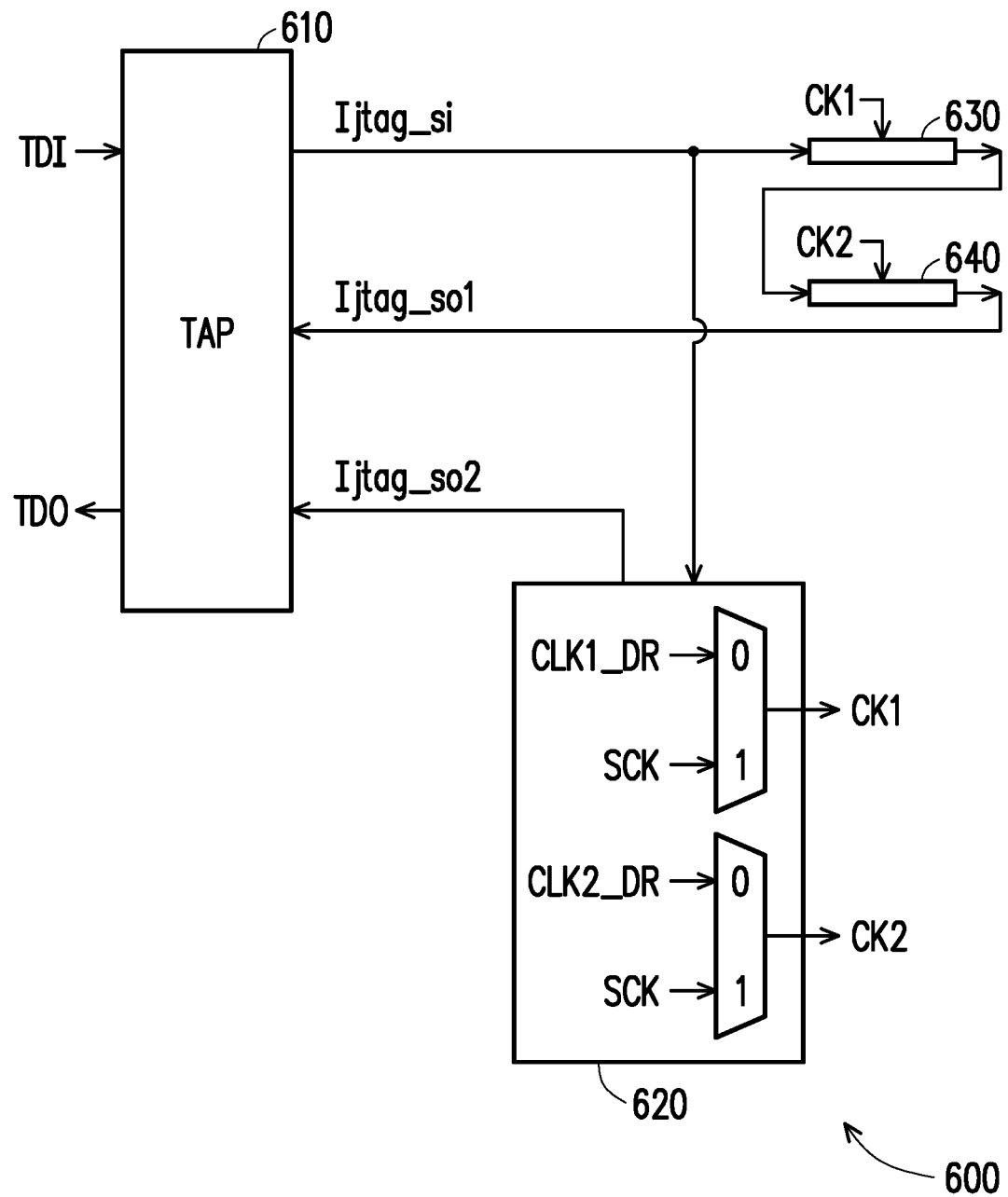
FIG. 6 is a schematic diagram of a tested circuit 600 according to another embodiment of the disclosure.

FIG. 6 is a schematic diagram of a tested circuit 600 according to another embodiment of the disclosure. Multiple flip-flops in the tested circuit 600 may be connected in series to form scan chains to serve as test paths during a test, such as test paths 630 and 640 shown in FIG. 6. The test paths 630 and 640 shown in FIG. 6 may be deduced by analogy with reference to the relevant descriptions of the test paths 230 and 240 shown in FIGS. 2 to 5, which will not be reiterated here. It is assumed that the test paths 630 and 640 belong to different clock domains.

The testing circuit may be configured in the tested circuit 600 to perform testing on the tested circuit 600 through the test paths 630 and 640. In the embodiment shown in FIG. 6, the testing circuit includes a TAP circuit 610 and a clock supply circuit 620. In some embodiments, according to design requirements, the TAP circuit 610 may be a well-known TAP circuit compliant with the JTAG standard or IEEE 1149.1 standard, or any other TAP circuit. In other embodiments, the TAP circuit 610 may be deduced by analogy with reference to the relevant description of the TAP circuit 210 shown in FIG. 2.

The scan output terminal Ijtag_si of the TAP circuit 610 is coupled to a first terminal (input terminal) of the test path 630 of the tested circuit 600. A second terminal (output terminal) of the test path 630 is coupled to a first terminal (input terminal) of the test path 640 of the tested circuit 600. A second terminal (output terminal) of the test path 640 is coupled to a scan input terminal Ijtag_so1 of the TAP circuit 610. The clock supply circuit 620 is coupled to the scan output terminal Ijtag_si and a scan input terminal Ijtag_so2 of the TAP circuit 610.

Here, a known shift operation of the ATPG system is referred to as a shift operation mode, and a known capture operation of the ATPG system is referred to as a capture operation mode. In the shift operation mode, the clock supply circuit 620 may use a shift clock signal SCK as clock signals CK1 and CK2, and provide the clock signals CK1 and CK2 to the test path 630 and the test path 640. A test pattern outputted by the scan output terminal Ijtag_si of the TAP circuit 610 may be loaded to the test paths 630 and 640 based on triggering by the clock signals CK1 and CK2.

In the capture operation mode, the clock supply circuit 620 may output a clock signal CLK1_DR as the clock signal CK1 and output a clock signal CLK2_DR as the clock signal CK2. The clock signal CK1 is provided to the test path 630 and the clock signal CK2 is provided to the test path 640. A phase of the clock signal CLK1_DR is different from that of the clock signal CLK2_DR. Therefore, in the capture operation mode, a trigger timing of the test path 630 may be different from a trigger timing of the test path 640. That is, the testing circuit may respectively provide the different clock signals CLK1_DR and CLK2_DR to the different test paths 630 and 640 belonging to the different clock domains in the capture operation mode of the ATPG system, and in the shift operation mode of the ATPG system, the shift clock signal SCK is provided to the test paths. Therefore, the testing circuit can enable the different test paths 630 and 640 belonging to the different clock domains to capture correct data in the capture operation mode, thereby avoiding an error of the operation of the ATPG system or the test results.

Figure 7:
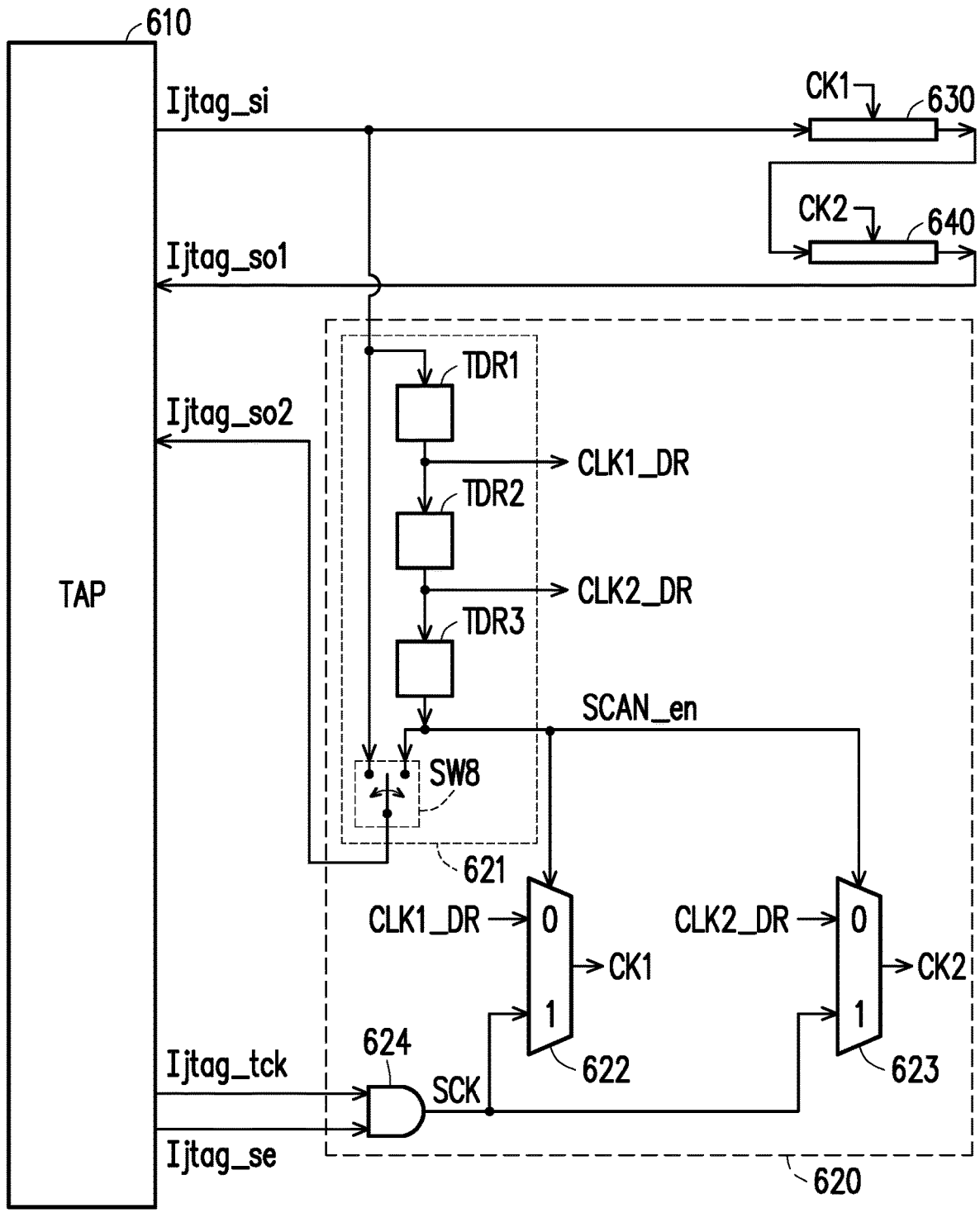
FIG. 7 is a schematic diagram of a clock supply circuit 620 according to another embodiment of the disclosure.

FIG. 7 is a schematic diagram of the clock supply circuit 620 according to an embodiment of the disclosure. In the embodiment shown in FIG. 7, the clock supply circuit 620 includes a clock generation circuit 621, a multiplexer 622, a multiplexer 623, and an AND gate 624. A first input terminal of the AND gate 624 is coupled to the TAP circuit 610 to receive a test clock Ijtag_tck. A second input terminal of the AND gate 624 is coupled to the TAP circuit 610 to receive a shift data register status enable signal Ijtag_se. The shift data register status enable signal Ijtag_se indicates whether a shift data register status Shift-DR is enabled, herein the shift data register status Shift-DR is compliant with the JTAG standard (or IEEE 1149.1 standard). An output terminal of the AND gate 624 is coupled to the multiplexer 622 and the multiplexer 623 to provide the shift clock signal SCK.

The clock generation circuit 621 is coupled to the scan output terminal Ijtag_si and the scan input terminal Ijtag_so2 of the TAP circuit 610. The clock generation circuit 621 may generate the clock signal CLK1_DR and the clock signal CLK2_DR with different phases. A first input terminal of the multiplexer 622 is coupled to the clock generation circuit 621 to receive the clock signal CLK1_DR. A second input terminal of the multiplexer 622 is coupled to the output terminal of the AND gate 624 to receive the shift clock signal SCK. The multiplexer 622 may choose to provide the shift clock signal SCK as the clock signal CK1 to the test path 630 in the shift operation mode. The multiplexer 622 may choose to provide the clock signal CLK1_DR as the clock signal CK1 to the test path 630 in the capture operation mode. A first input terminal of the multiplexer 623 is coupled to the clock generation circuit 621 to receive the clock signal CLK2_DR. A second input terminal of the multiplexer 623 is coupled to the output terminal of the AND gate 624 to receive the shift clock signal SCK. The multiplexer 623 may choose to provide the shift clock signal SCK as the clock signal CK2 to the test path 640 in the shift operation mode. The selector 623 may choose to provide the clock signal CLK2_DR as the clock signal CK2 to the test path 640 in the capture operation mode.

In the embodiment shown in FIG. 7, the clock generation circuit 621 includes a switching circuit SW8, a register TDR1, a register TDR2 and a register TDR3. The registers TDR1, TDR2, and TDR3 may be test data registers compliant with the JTAG standard or IEEE 1149.1 standard. A first input terminal of the switching circuit SW8 is coupled to the scan output terminal Ijtag_si of the TAP circuit 610. An output terminal of the switching circuit SW8 is coupled to the scan input terminal Ijtag_so2 of the TAP circuit 610. An input terminal of the register TDR1 is coupled to the scan output terminal Ijtag_si of the TAP circuit 610. An output terminal of the register TDR1 is coupled to the first input terminal of the multiplexer 622 to provide the clock signal CLK1_DR. An input terminal of the register TDR2 is coupled to the output terminal of register TDR1. An output terminal of the register TDR2 is coupled to the first input terminal of the multiplexer 623 to provide the clock signal CLK2_DR. An input terminal of the register TDR3 is coupled to the output terminal of register TDR2. The output terminal of the register TDR3 is coupled to a second input terminal of the switching circuit SW8, a control terminal of the multiplexer 622 and a control terminal of the multiplexer 623 to provide a scan enable signal SCAN_en. The ATPG system may write a logic value corresponding to the operating status into the register TDR3 through the TAP circuit 610. When scan enable signal SCAN_en is at a first logic state (for example, high logic level), indicates that the ATPG system is in the shift operation mode, when the scan enable signal SCAN_en is at a second logic state (for example, low logic level), indicates that the ATPG system is in the capture operation mode.

Figure 8:
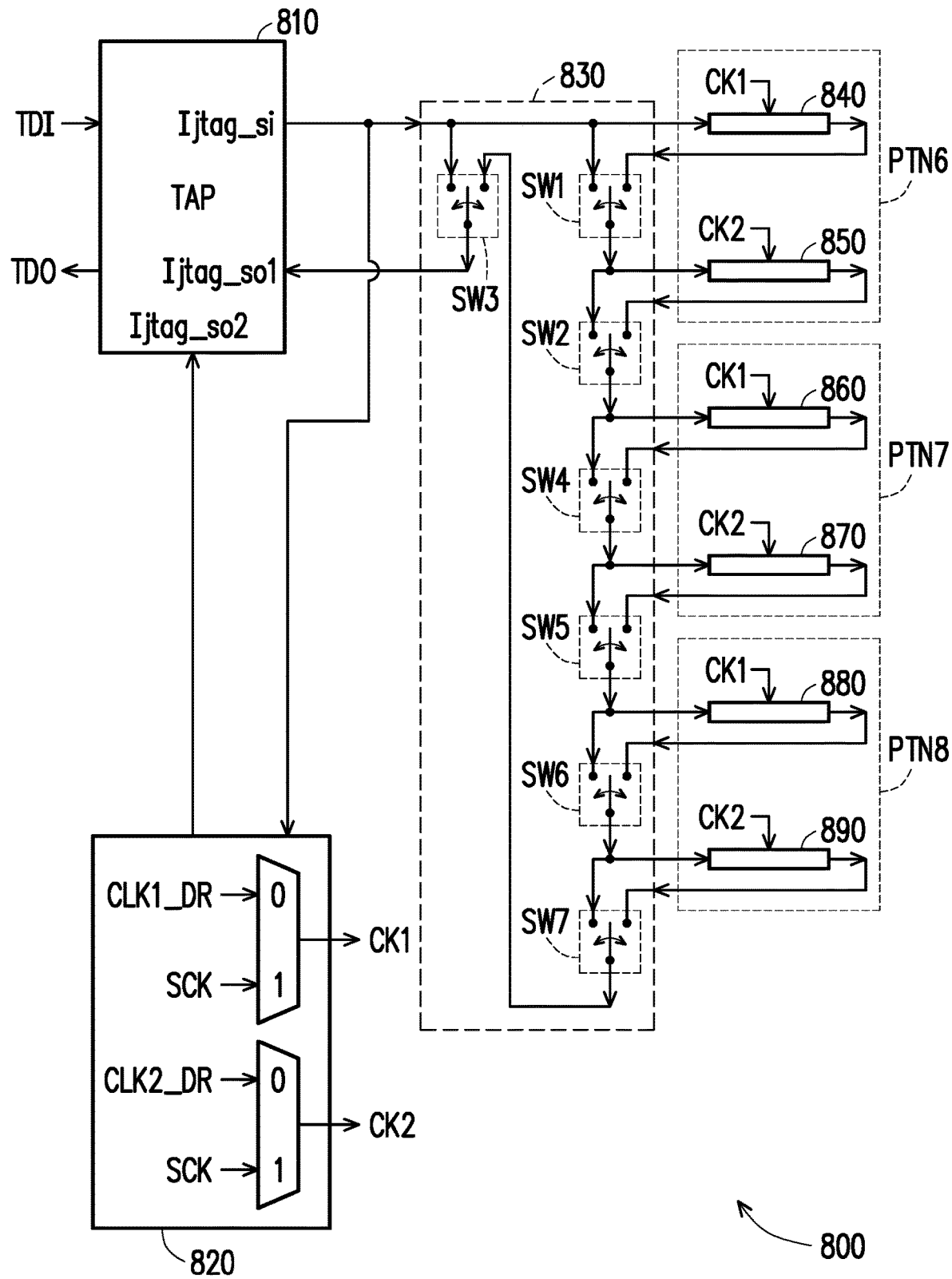
FIG. 8 is a schematic diagram of a tested circuit 800 according to yet another embodiment of the disclosure.

FIG. 8 is a schematic diagram of a tested circuit 800 according to another embodiment of the disclosure. The tested circuit 800 shown in FIG. 8 includes a core circuit PTN6, a core circuit PTN7 and a core circuit PTN8. The core circuit PTN8 may be used as an upper level circuit of the core circuit PTN6 and the core circuit PTN7, that is, the core circuit PTN8 may include the core circuit PTN6 and the core circuit PTN7. Each of the core circuits PTN6, PTN7 and PTN8 includes multiple test paths. For example, the core circuit PTN6 includes test paths 840 and 850, the core circuit PTN7 includes test paths 860 and 870, and the core circuit PTN8 includes test paths 880 and 890. The core circuits PTN6, PTN7 and/or PTN8 and the test paths 840, 850, 860, 870, 880, and/or 890 shown in FIG. 8 may be deduced by analogy with reference to the relevant descriptions of the core circuits PTN3, PTN4 and/or PTN5 and the test paths 230, 240, 250, 260, 270, and/or 280 shown in FIG. 5, which will not be reiterated here.

The testing circuit may be configured in the tested circuit 800 to perform test on the tested circuit 800 through the test paths 840~890. In the embodiment shown in FIG. 8, the testing circuit includes a TAP circuit 810, a clock supply circuit 820, and a routing circuit 830. In some embodiments, according to the design requirements, the TAP circuit 810 may be a well-known TAP circuit compliant with the JTAG standard or the IEEE 1149.1 standard, or any other TAP circuit. In other embodiments, the TAP circuit 810 may be deduced by analogy with reference to the relevant descriptions of the TAP circuit 210 shown in FIGS. 2 to 5, and/or deduced by analogy with reference to the relevant descriptions of the TAP circuit 610 shown in FIGS. 6 and 7.

The clock supply circuit 820 is coupled to the scan output terminal Ijtag_si and the scan input terminal Ijtag_so2 of the TAP circuit 810. In the shift operation mode, the clock supply circuit 820 may use the shift clock signal SCK as the clock signals CK1 and CK2, and provide the clock signals CK1 and CK2 to the test paths 840~890. It is assumed that a clock domain the test paths 840, 860 and 880 belong to is different from a clock domain the test paths 850, 870 and 890 belong to. In the capture operation mode, the clock supply circuit 820 may output the clock signal CLK1_DR as the clock signal CK1 and output the clock signal CLK2_DR as the clock signal CK2. The clock signal CK1 is provided to the test paths 840, 860 and 880. The clock signal CK2 is provided to the test paths 850, 870 and 890. The clock supply circuit 820 may be deduced by analogy with reference to the relevant descriptions of the clock supply circuit 620 shown in FIGS. 6 and 7, which will not be reiterated here. Therefore, the testing circuit can enable the different test paths 840 (860, 880) and 850 (870, 890) belonging to different clock domains to capture correct data in the capture operation mode, thereby avoiding the error of the operation of the ATPG system or the test results.

The routing circuit 830 is coupled to the scan output terminal Ijtag_si and the scan input terminal Ijtag_so1 of the TAP circuit 810. The routing circuit 830 may selectively couple one or more of the multiple test paths 840~890 of the tested circuit 800 to the TAP circuit 810 to perform the chip aging experiment, the chip system test and/or other tests. The routing circuit 830 may be deduced by analogy with reference to the relevant descriptions of the routing circuit 220 shown in FIGS. 2 to 5, which will not be reiterated here. Therefore, the testing circuit may flexibly set the length(s) of the scan chain(s) based on the characteristics and/or the test requirements of the testing platform of the ATPG system.

In summary, in some embodiments, the testing circuit may selectively couple one or more of the multiple test paths to the TAP circuit. Therefore, the testing circuit may flexibly set the length(s) of the scan chain(s) based on the characteristics and/or the requirements of the testing platform of the ATPG system. In some embodiments, the testing circuit may provide different clock signals to different test paths belonging to different clock domains in the capture operation mode of the ATPG system, and provide the same clock signal to different test paths in the shift operation mode of the ATPG system. Therefore, the testing circuit can enable different test paths belonging to different clock domains to capture correct data in the capture operation mode, thereby avoiding the error of the operation of the ATPG system or the test results.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A circuit, comprising:
a test access port circuit, comprising a first scan input terminal and a scan output terminal;
a routing circuit, comprising a first input terminal, a first output terminal, a second input terminal, a second output terminal, a third input terminal and a third output terminal, wherein said first input terminal and said first output terminal of said routing circuit are respectively coupled to said scan output terminal and said first scan input terminal of said test access port circuit;
a first test path, comprising a first terminal and a second terminal, wherein said first terminal of said first test path is coupled to said second input terminal of said routing circuit, said second terminal of said first test path is coupled to said second output terminal of said routing circuit; and
a second test path, comprising a first terminal and a second terminal, wherein said first terminal of said second test path is coupled to said third input terminal of said routing circuit, and said second terminal of said second test path is coupled to said third output terminal of said routing circuit,
wherein said routing circuit couples said scan output terminal of said test access port circuit to said first scan input terminal of said test access port circuit or said first terminal of said first test path or said first terminal of said second test path.

2. The circuit according to claim 1, wherein in a serial connection scan mode, said routing circuit connects said first test path and said second test path in series, couples said scan output terminal of said test access port circuit to said first terminal of said second test path, and couples said first scan input terminal of said test access port circuit to said second terminal of said first test path.

3. The circuit according to claim 1, wherein in a partial scan mode, said routing circuit couples said scan output terminal of said test access port circuit to said first terminal of said first test path, couples said first scan input terminal of said test access port circuit to said second terminal of said first test path, and cut off a connection between said second test path and said test access port circuit.

4. The circuit according to claim 1, wherein said routing circuit comprises:
a first switching circuit, comprising a first input terminal, a second input terminal and an output terminal, wherein said first input terminal or said second input terminal of said first switching circuit is electrically connected to said output terminal of said first switching circuit; and
a second switching circuit, comprising a first input terminal, a second input terminal, and an output terminal, wherein said first input terminal or said second input terminal of said second switching circuit is electrically connected to said output terminal of said second switching circuit,
wherein said first input terminal of said first switching circuit is coupled to said scan output terminal of said test access port circuit and said first terminal of said first test path, said second input terminal of said first switching circuit is coupled to said second terminal of said first test path, and said output terminal of said first switching circuit is coupled to said first terminal of said second test path, and
wherein said first input terminal of said second switching circuit is coupled to said output terminal of said first switching circuit, said second input terminal of said second switching circuit is coupled to said second terminal of said second test path, and said output terminal of said second switching circuit is coupled to said first scan input terminal of said test access port circuit.

5. The circuit according to claim 1, wherein said routing circuit comprises:
a first switching circuit, comprising a first input terminal, a second input terminal and an output terminal, wherein said first input terminal or said second input terminal of said first switching circuit is electrically connected to said output terminal of said first switching circuit;
a second switching circuit, comprising a first input terminal, a second input terminal and an output terminal, wherein said first input terminal or said second input terminal of said second switching circuit is electrically connected to said output terminal of said second switching circuit, and
a third switching circuit, comprising a first input terminal, a second input terminal and an output terminal, wherein said first input terminal or said second input terminal of said third switching circuit is electrically connected to said output terminal of said third switching circuit,
wherein said first input terminal of said first switching circuit is coupled to said scan output terminal of said test access port circuit and said first terminal of said first test path, said second input terminal of said first switching circuit is coupled to said second terminal of said first test path, and said output terminal of said first switching circuit is coupled to said first terminal of said second test path,
wherein said first input terminal of said second switching circuit is coupled to said output terminal of said first switching circuit, said second input terminal of said second switching circuit is coupled to said second terminal of said second test path, said output terminal of said second switching circuit is coupled to said second input terminal of said third switching circuit, said first input terminal of said third switching circuit is coupled to said scan output terminal of said test access port circuit, and said output terminal of said third switching circuit is coupled to said first scan input terminal of said test access port circuit.

6. The circuit according to claim 5, wherein any one of said first switching circuit, said second switching circuit, and said third switching circuit is a segment insertion bit element.

7. The circuit according to claim 1, further comprising:
a clock supply circuit, wherein in a shift operation mode, said clock supply circuit provides a shift clock signal to said first test path and said second test path, and wherein in a capture operation mode, said clock supply circuit provides a first clock signal to said first test path and provides a second clock signal to said second test path.

8. The circuit according to claim 7, wherein said clock supply circuit comprises:
a clock generation circuit, to generate said first clock signal and said second clock signal with different phases;
a first selector, comprising a first input terminal, a second input terminal, a control terminal and an output terminal, wherein said first input terminal of said first selector is coupled to said clock generation circuit to receive said first clock signal, said second input terminal of said first selector receives said shift clock signal, said first selector provides said shift clock signal to said first test path in said shift operation mode, and provides said first clock signal to said first test path in said capture operation mode; and a second selector, comprising a first input terminal, a second input terminal, a control terminal and an output terminal, wherein said first input terminal of said second selector is coupled to said clock generation circuit to receive said second clock signal, said second input terminal of said second selector receives said shift clock signal, said second selector provides said shift clock signal to said second test path in said shift operation mode, and provides said second clock signal to said second test path in said capture operation mode.

9. The circuit according to claim 8, wherein said clock supply circuit further comprises:

a logic gate, coupled to said second input terminal of said first selector and said second input terminal of said second selector to provide said shift clock signal to said first selector and said second selector.

10. The circuit according to claim 8, wherein said clock generation circuit comprises:

a switching circuit, comprising a first input terminal, a second input terminal and an output terminal, wherein said first input terminal of said switching circuit is coupled to said scan output terminal of said test access port circuit, said output terminal of said switching circuit is coupled to a second scan input terminal of said test access port circuit;

a first register, comprising an input terminal and an output terminal, wherein said input terminal of said first register is coupled to said scan output terminal of said test access port circuit, said output terminal of said first register is coupled to said first input terminal of said first selector to provide said first clock signal;

a second register, comprising an input terminal and an output terminal, wherein said input terminal of said second register is coupled to said output terminal of said first register and said output terminal of said second register is coupled to said first input terminal of said second selector to provide said second clock signal; and a third register, comprising an input terminal and an output terminal, wherein said input terminal of said third register is coupled to said output terminal of said second register, said output terminal of said third register is coupled to said second input terminal of said switching circuit, said control terminal of said first selector and said control terminal of said second selector to provide a scan enable signal, wherein when said scan enable signal is at a first logic state, said circuit works in said shift operation mode, when said scan enable signal is at a second logic state, said circuit works in said capture operation mode.

11. A testing circuit of a circuit, comprising:

a test access port circuit, wherein a scan output terminal of said test access port circuit is coupled to a first terminal of a first test path of said circuit, a second terminal of said first test path is coupled to a first terminal of a second test path of said circuit, and a second terminal of said second test path is coupled to a first scan input terminal of said test access port circuit; and a clock supply circuit, wherein in a shift operation mode, said clock supply circuit provides a shift clock signal to said first test path and said second test path, and in a capture operation mode, said clock supply circuit provides a first clock signal to said first test path, provides a second clock signal to said second test path.

12. The testing circuit according to claim 11, wherein said clock supply circuit comprises:

a clock generation circuit, to generate said first clock signal and said second clock signal with different phases;

a first selector, comprising a first input terminal, a second input terminal, a control terminal and an output terminal, wherein said first input terminal of said first selector is coupled to said clock generation circuit to receive said first clock signal, said second input terminal of said first selector receives said shift clock signal, said first selector provides said shift clock signal to said first test path in said shift operation mode, and provides said first clock signal to said first test path in said capture operation mode; and a second selector, comprising a first input terminal, a second input terminal, a control terminal and an output terminal, wherein said first input terminal of said second selector is coupled to said clock generation circuit to receive said second clock signal, said second input terminal of said second selector receives said shift clock signal, said second selector provides said shift clock signal to said second test path in said shift operation mode, and provides said second clock signal to said second test path in said capture operation mode.

13. The testing circuit according to claim 12, wherein said clock supply circuit further comprises:

a logic gate, coupled to said second input terminal of said first selector and said second input terminal of said second selector to provide said shift clock signal to said first selector and said second selector.

14. The testing circuit according to claim 12, wherein said clock generation circuit comprises:

a switching circuit, comprising a first input terminal, a second input terminal and an output terminal, wherein said first input terminal of said switching circuit is coupled to said scan output terminal of said test access port circuit, said output terminal of said switching circuit is coupled to a second scan input terminal of said test access port circuit;

a first register, comprising an input terminal and an output terminal, wherein said input terminal of said first register is coupled to said scan output terminal of said test access port circuit, said output terminal of said first register is coupled to said first input terminal of said first selector to provide said first clock signal;

a second register, comprising an input terminal and an output terminal, wherein said input terminal of said second register is coupled to said output terminal of said first register, said output terminal of said second register is coupled to said first input terminal of said second selector to provide said second clock signal; and a third register, comprising an input terminal and an output terminal, wherein said input terminal of said third register is coupled to said output terminal of said second register, said output terminal of said third register is coupled to said second input terminal of said switching circuit, said control terminal of said first selector and said control terminal of said second selector to provide a scan enable signal, wherein when said scan enable signal is at a first logic state, said circuit works in said shift operation mode, when said scan enable signal is at a second logic state, said circuit works in said capture operation mode.

\* \* \* \* \*